United States Patent
Chuang et al.

(10) Patent No.: US 11,450,553 B2
(45) Date of Patent: Sep. 20, 2022

(54) SEMICONDUCTOR STRUCTURE AND METHOD OF FORMING THE SAME

(71) Applicant: NANYA TECHNOLOGY CORPORATION, New Taipei (TW)

(72) Inventors: Ying-Cheng Chuang, Taoyuan (TW); Chung-Lin Huang, Taoyuan (TW); Lai-Cheng Tien, New Taipei (TW); Chih-Lin Huang, Taipei (TW); Zhi-Yi Huang, Taichung (TW); Hsu Chiang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 70 days.

(21) Appl. No.: 16/993,251

(22) Filed: Aug. 13, 2020

(65) Prior Publication Data
US 2022/0051931 A1    Feb. 17, 2022

(51) Int. Cl.
*H01L 21/762* (2006.01)
*H01L 23/00* (2006.01)

(52) U.S. Cl.
CPC .. *H01L 21/76205* (2013.01); *H01L 21/76224* (2013.01); *H01L 23/562* (2013.01)

(58) Field of Classification Search
CPC ......... H01L 21/76205; H01L 21/76224; H01L 23/562
See application file for complete search history.

(56) References Cited

U.S. PATENT DOCUMENTS

| | | |
|---|---|---|
| 2005/0142745 A1 | 6/2005 | Jung et al. |
| 2018/0033626 A1* | 2/2018 | Liao ................ H01L 21/823431 |
| 2020/0098632 A1 | 3/2020 | Lee et al. |

* cited by examiner

*Primary Examiner* — Julia Slutsker
(74) *Attorney, Agent, or Firm* — CKC & Partners Co., LLC (57) ABSTRACT

A method of forming a semiconductor structure includes following steps. A semiconductor material structure is formed over a substrate. A first pad layer is formed over the semiconductor material structure. The first pad layer and the semiconductor material structure are etched to form a trench. An oxidation process is performed on a sidewall of the semiconductor material structure to form a first oxide structure on the sidewall of the semiconductor material structure. A second oxide structure is formed in the trench.

4 Claims, 10 Drawing Sheets

SEMICONDUCTOR STRUCTURE AND METHOD OF FORMING THE SAME

BACKGROUND

Technical Field

The present disclosure relates to a method of forming a semiconductor structure and a semiconductor structure.

Description of Related Art

With the rapid growth of electronic industry, the development of integrated circuits (ICs) has achieved high performance and miniaturization. A deposition process is typically performed to form oxide structure surrounding the active area and followed by an annealing process. However, the stress is increased during the annealing process and induces active area pattern scattering, thereby causing a shift problem of active area pattern.

The pattern scattering may be solved by enlarging pattern dimension, which can adversely enlarge the size of the integrated circuit. Therefore, a more efficient method is needed to solve pattern scattering.

SUMMARY

One aspect of the present disclosure is a method of forming a semiconductor structure.

According to some embodiments of the present disclosure, a method of forming a semiconductor structure includes following steps. A semiconductor material structure is formed over a substrate. A first pad layer is formed over the semiconductor material structure. The first pad layer and the semiconductor material structure are etched to form a trench. An oxidation process is performed on a sidewall of the semiconductor material structure to form a first oxide structure on the sidewall of the semiconductor material structure. A second oxide structure is formed in the trench.

In some embodiments, the oxidation process is performed such that a sidewall of the first pad layer is free of the first oxide structure.

In some embodiments, forming the second oxide structure is performed such that the first oxide structure is in contact with the second oxide structure.

In some embodiments, the method of forming the semiconductor structure further includes prior to etching the first pad layer and the semiconductor material structure, forming a second pad layer over the first pad layer.

In some embodiments, the method of forming the semiconductor structure further includes etching the second pad layer.

In some embodiments, forming the second oxide structure in the trench further includes forming the second oxide structure over the second pad layer.

In some embodiments, the method of forming the semiconductor structure further includes removing the second pad layer after forming the second oxide structure.

In some embodiments, the oxidation process is performed by a thermal oxidation process.

In some embodiments, the second oxide structure is performed by a flowable chemical vapor deposition process.

Another aspect of the present disclosure is a semiconductor structure.

According to some embodiments of the present disclosure, a semiconductor structure includes a substrate, a semiconductor material structure, a pad layer, a first oxide structure, and a second oxide structure. The semiconductor material structure is disposed over the substrate. The pad layer is disposed over the semiconductor material structure. The first oxide structure is disposed on a sidewall of the semiconductor material structure. The second oxide structure is disposed on a sidewall of the first oxide structure and a sidewall of the pad layer.

In some embodiments, the second oxide structure is in contact with the sidewall of the first oxide structure and the sidewall of the pad layer.

In some embodiments, the second oxide structure and the semiconductor material structure are separated by the first oxide structure.

In some embodiments, a top surface of the second oxide structure and a top surface of the pad layer are at same horizontal level.

In some embodiments, the first oxide structure and the second oxide structure are made of same materials.

In the aforementioned embodiments, since the oxidation process is performed on the sidewall of the semiconductor material structure to form the first oxide structure, the stress can be released and the problem of high stress can be inhibited, thereby preventing the shift problem. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

FIGS. 1-9 are cross-sectional views of a method of forming a semiconductor structure at various stages in accordance with some embodiments of the present disclosure. It is noted that the semiconductor structure includes an array area and a periphery area adjacent to the array area. For clarify, the present disclosure illustrates the array area of the semiconductor structure in FIGS. 1-9, and the periphery area of the semiconductor structure is not shown in FIGS. 1-9.

Figure 1:
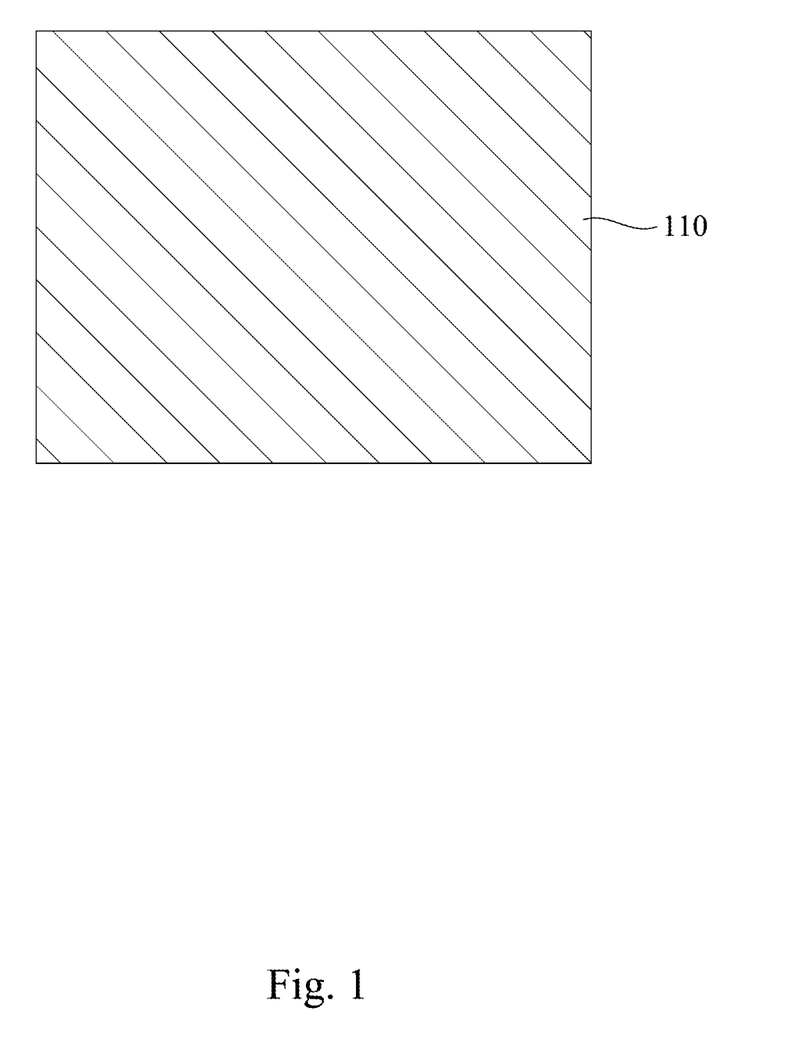
FIGS. 1-9 are cross-sectional views of a method of forming a semiconductor structure at various stages in accordance with some embodiments of the present disclosure.
Figure 2:
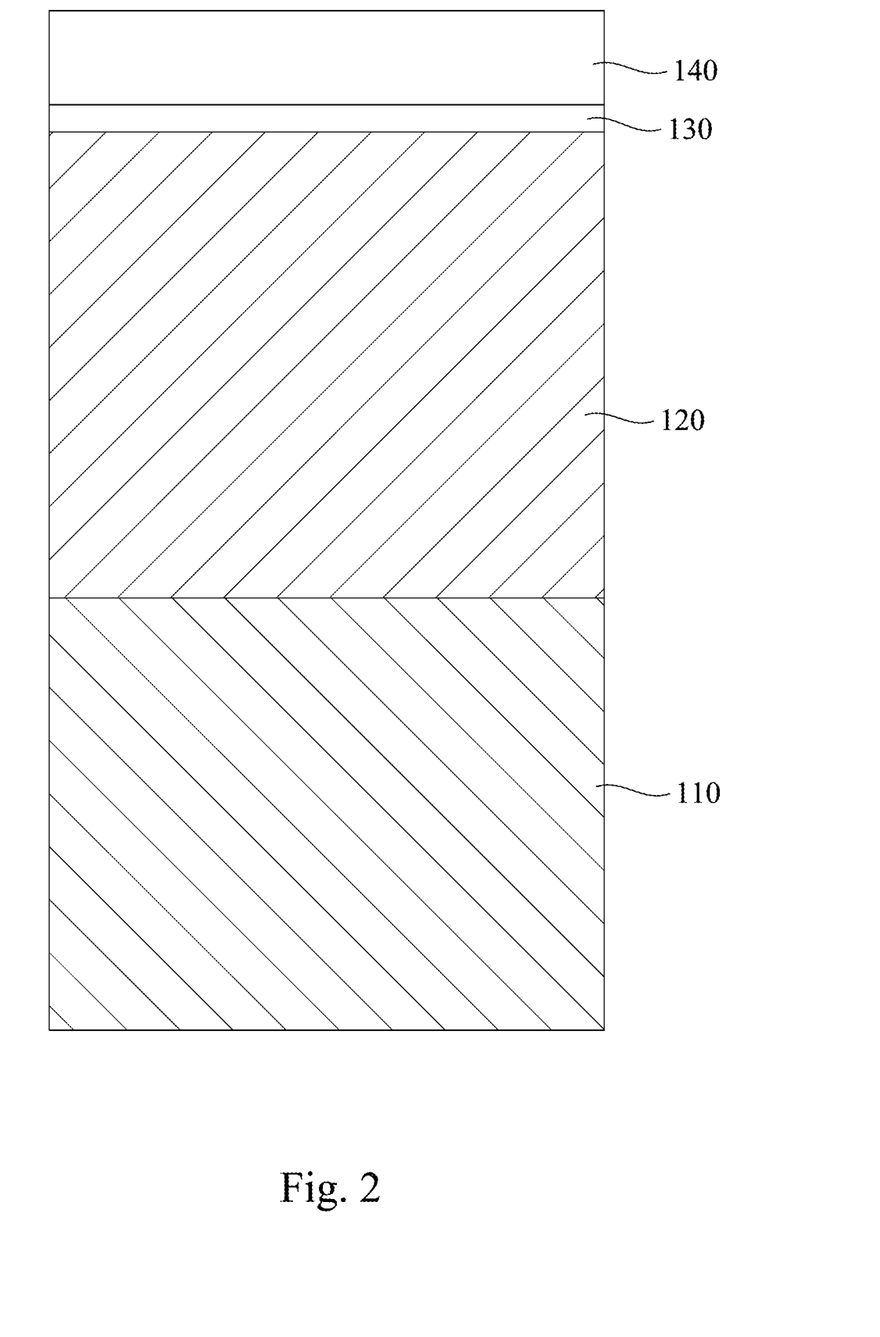

Referring to FIG. 1 and FIG. 2, a semiconductor material structure 120 is formed over a substrate 110. In some embodiments, the substrate 110 and the semiconductor material structure 120 may include an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In addition, the substrate 110 may be a p-type substrate, such as a silicon material doped with a p-type dopant (e.g., boron).

In some embodiments, a thickness of the substrate 110 is greater than a thickness of the semiconductor material structure 120. In some embodiments, the semiconductor material structure 120 and the substrate 110 are integratedly formed as a single piece.

Thereafter, a first pad layer 130 may be formed over the semiconductor material structure 120, and a second pad layer 140 may be formed on the first pad layer 130. In some embodiments, the first pad layer 130 is deposited over the semiconductor material structure 120 by suitable techniques, such as atomic layer deposition (ALD), chemical vapor deposition (CVD), physical vapor deposition (PVD), thermal oxidation, combinations thereof, or other suitable techniques. The first pad layer 130 may be a thin pad oxide layer, and the first pad layer 130 is made of silicon oxide or other suitable materials. In some embodiments, the second pad layer 140 is deposited over the first pad layer 130 by suitable techniques, such as atomic layer deposition (ALD), chemical vapor deposition (CVD), physical vapor deposition (PVD), combinations thereof, or other suitable techniques. A thickness of the second pad layer 140 may be greater than a thickness of the first pad layer 130. The second pad layer 140 is made of silicon nitride or other suitable materials. In some embodiments, the second pad layer 140 and the first pad layer 130 are made of different materials. For example, first pad layer 130 is made of silicon oxide, while the second pad layer 140 is made of silicon nitride.

Figure 3:
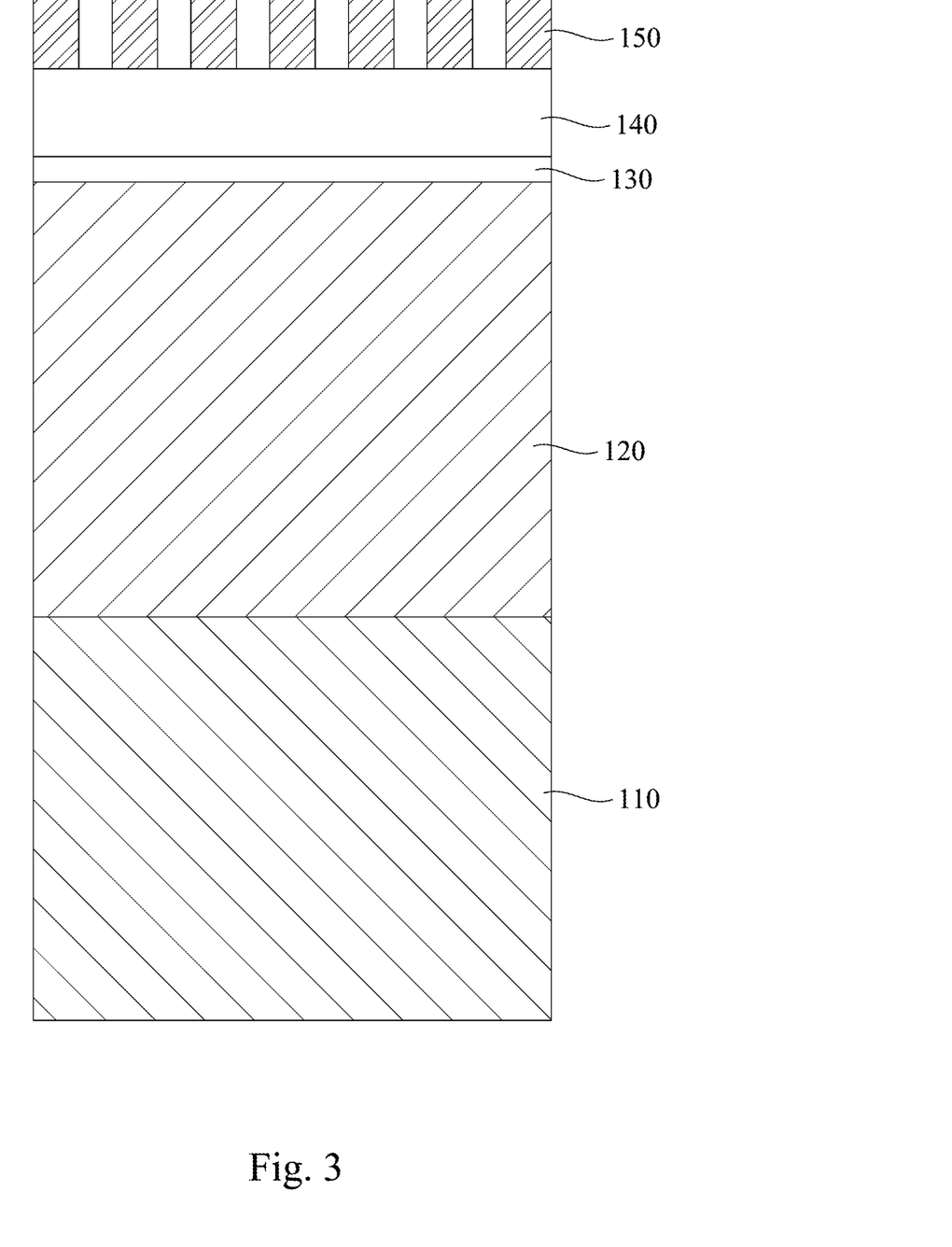

Referring to FIG. 3, after the second pad layer 140 is formed on the first pad layer 130, a patterned photoresist layer 150 is formed over the second pad layer 140. In greater details, the patterned photoresist layer 150 is formed by forming a photoresist layer over the second pad layer 140 and then patterning the photoresist layer by using suitable photolithography techniques. For example, after spin-on coating the photoresist layer onto the second pad layer 140, the photoresist layer is exposed to a pattern of light radiation. In some embodiments, the patterned photoresist layer 150 covers a portion of the second pad layer 140, and the other portions of the second pad layer 140 are exposed.

Figure 4:
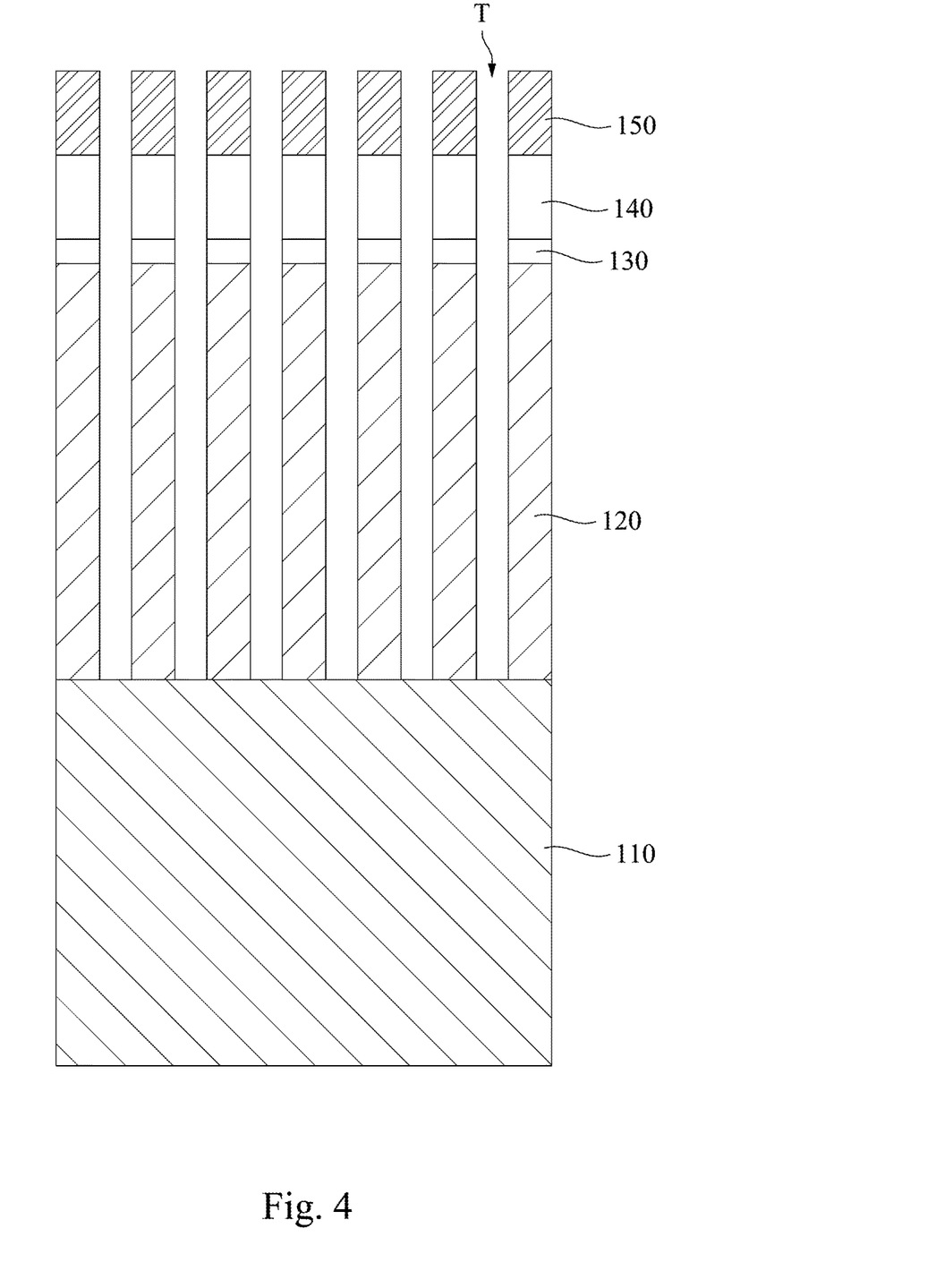

Referring to FIG. 4, the second pad layer 140 is etched to form a first trench using the patterned photoresist layer 150 as an etch mask. The second pad layer 140 is etched until the first pad layer 130 is exposed. The second pad layer 140 is etched, for example, using anisotropic etch processes such as reactive ion etching (RIE) using chlorine ($Cl_2$), HBr or $CF_4$ as an etchant for the second pad layer 140.

After the second pad layer 140 is etched, the first pad layer 130 is etched to form a second trench using the patterned photoresist layer 150 as the etch mask, in which the second trench is communicated to the first trench. The first pad layer 130 is etched until the semiconductor material structure 120 is exposed. Thereafter, the semiconductor material structure 120 is etched to form a third trench using the patterned photoresist layer 150 as the etch mask, in which the third trench is communicated to the second trench. The semiconductor material structure 120 is etched until the substrate 110 is exposed. As a result, a trench T shown in FIG. 4 is formed. The trench T includes the above-mentioned first trench, the above-mentioned second trench, and the above-mentioned third trench. In some embodiments, the second pad layer 140, the first pad layer 130, and the semiconductor material structure 120 are etched using different etchants, while using the patterned photoresist layer 150 as the same etch mask.

In some embodiments, the semiconductor material structure 120 is referred as an active area in the array area.

Figure 5:
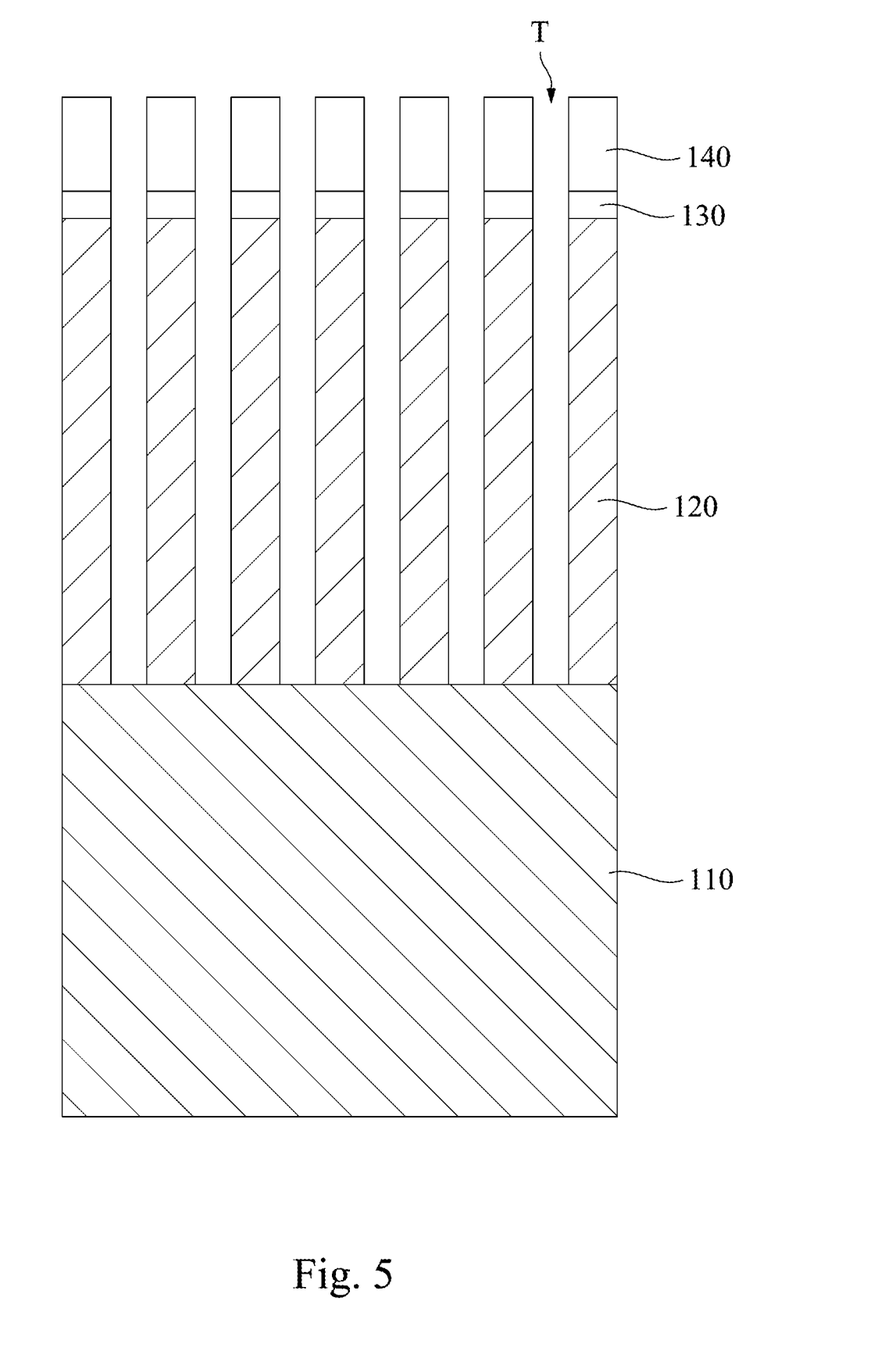

Referring to FIG. 4 and FIG. 5, the patterned photoresist layer 150 is removed. In some embodiments, removing the patterned photoresist layer 150 may be performed by using a photoresist strip process, such as an ashing process, and etching process, or other suitable processes.

Figure 6:
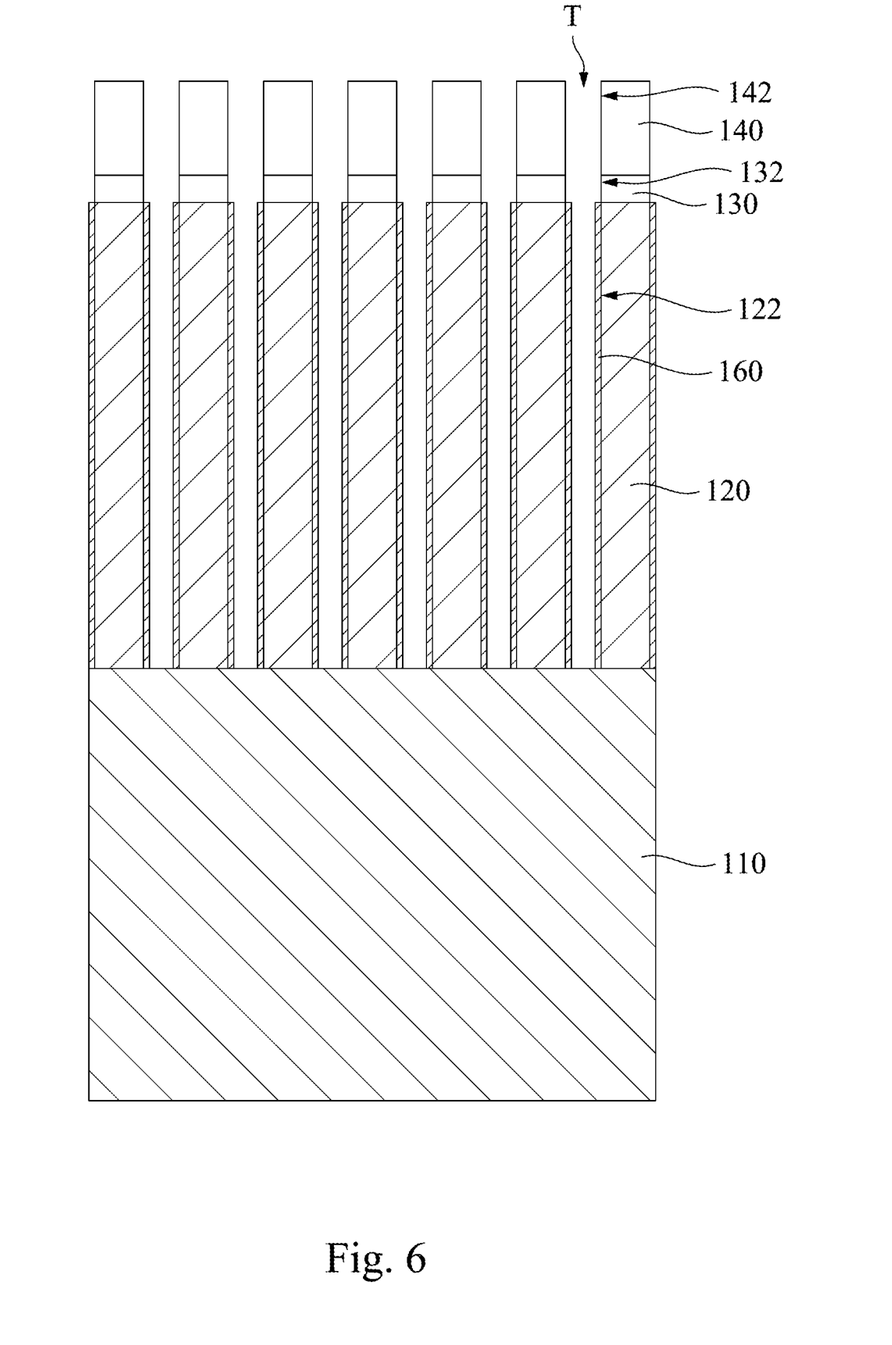

Referring to FIG. 6, an oxidation process is performed on a sidewall 122 of the semiconductor material structure 120 to form a first oxide structure 160 on the sidewall 122 of the semiconductor material structure 120. In greater details, the first oxide structure 160 is formed by performing a thermal oxidation process, such as an ISSG (in situ stream generation) process. The first oxide structure 160 may be referred as an oxide liner layer on the sidewall 122 of the semiconductor material structure 120.

In some embodiments, the first oxide structure 160 may be made of a combination of silicon and oxygen, in which a ratio of silicon in the first oxide structure 160 is in a range from about 45% to about 50%, and a ratio of oxygen in the first oxide structure 160 is in a range from about 50% to about 55%. For example, the ratio of silicon in the first oxide structure 160 is about 47% and the ratio of oxygen in the first oxide structure 160 is about 53%. In some embodiment, the ratio of silicon in the first oxide structure 160 is substantially equal to the ratio of oxygen in the first oxide structure 160.

In some embodiments, the oxidation process is performed such that a sidewall 132 of the first pad layer 130 is free of the first oxide structure 160. In addition, the oxidation process is performed such that a sidewall 142 of the second pad layer 140 is free of the first oxide structure 160. In other words, the oxidation process on the first pad layer 130 and the second pad layer 140 can be ignored, and thus the first oxide structure 160 is not formed on the sidewall 132 of the first pad layer 130 and the sidewall 142 of the second pad layer 140.

Figure 7:
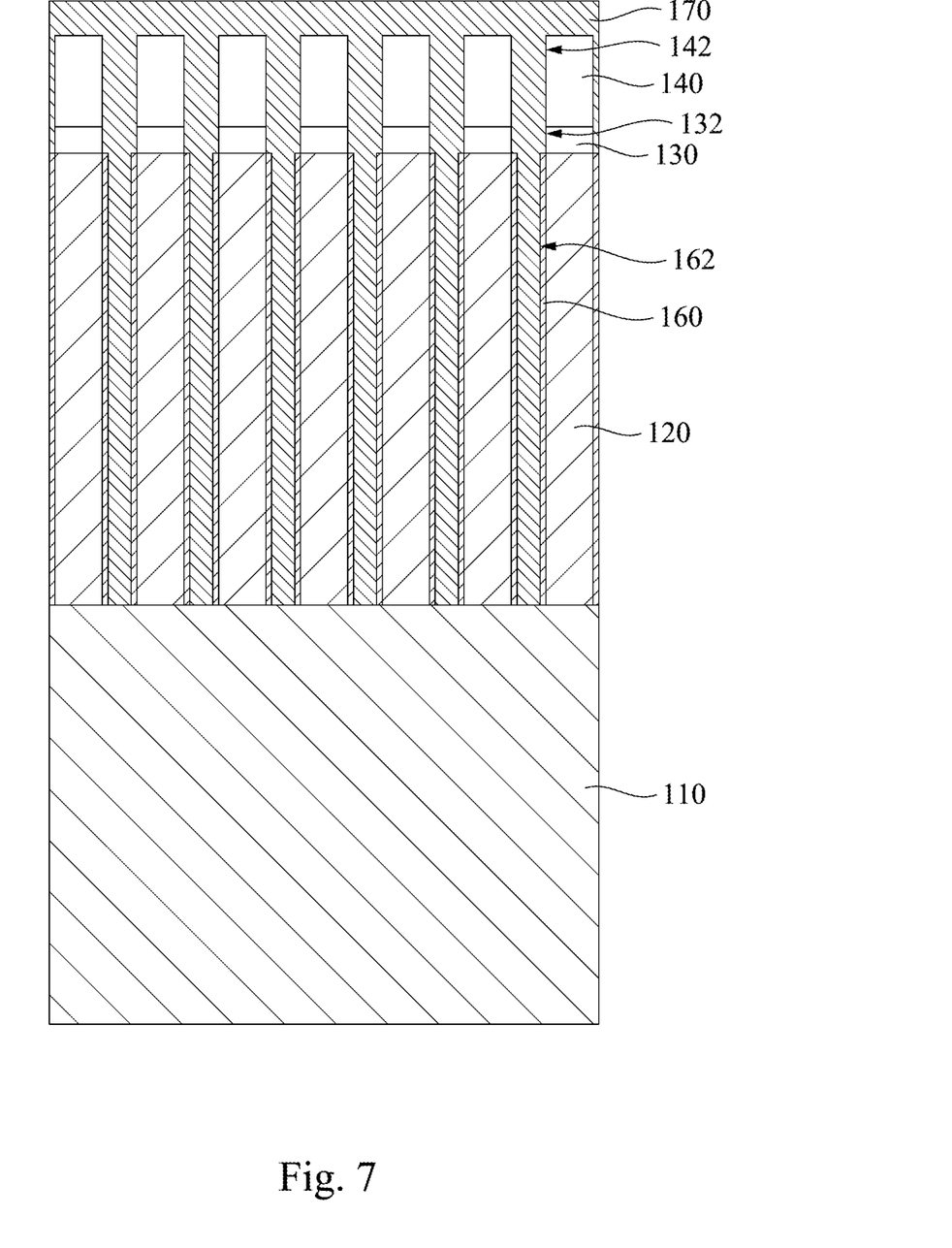

Referring to FIG. 6 and FIG. 7, after the first oxide structure 160 is formed on the sidewall 122 of the semiconductor material structure 120, a second oxide structure 170 is formed in the trench T. In greater details, the second oxide structure 170 is formed on a sidewall 162 of the first oxide structure, the sidewall 132 of the first pad layer 130, and the sidewall 142 of the second pad layer 140. Furthermore, the second oxide structure 170 is formed over and covers the second pad layer 140. In some embodiments, the second oxide structure 170 is formed in the trench T and over the second pad layer 140 by a deposition process, followed by an annealing process. As the configuration of the first oxide structure 160, the stress of the semiconductor material structure 120 (active area) in the array area can be released and the problem of high stress in the annealing process can be efficiently inhibited, thereby preventing the shift problem. As a result, two adjacent semiconductor material structures 120 (active area) in the array area can be arranged aligned with each other and the performance of the semiconductor structure can be improved.

In some embodiments, the second oxide structure 170 is formed by using chemical vapor deposition (CVD). For example, the second oxide structure 170 is formed by a flowable chemical vapor deposition (FCVD) process.

In some embodiments, the second oxide structure 170 is performed such that the second oxide structure 170 is in contact with the first oxide structure 160. In greater details, the second oxide structure 170 is in contact with the sidewall 162 of the first oxide structure 160, the sidewall 132 of the first pad layer 130, and the sidewall 142 of the second pad layer 140.

In some embodiments, the second oxide structure 170 and the first oxide structure 160 are made of different materials. The second oxide structure 170 and the semiconductor material structure 120 are separated by the first oxide structure 160. In some other embodiments, the second oxide structure 170 and the first oxide structure 160 are made of same materials.

Figure 8:
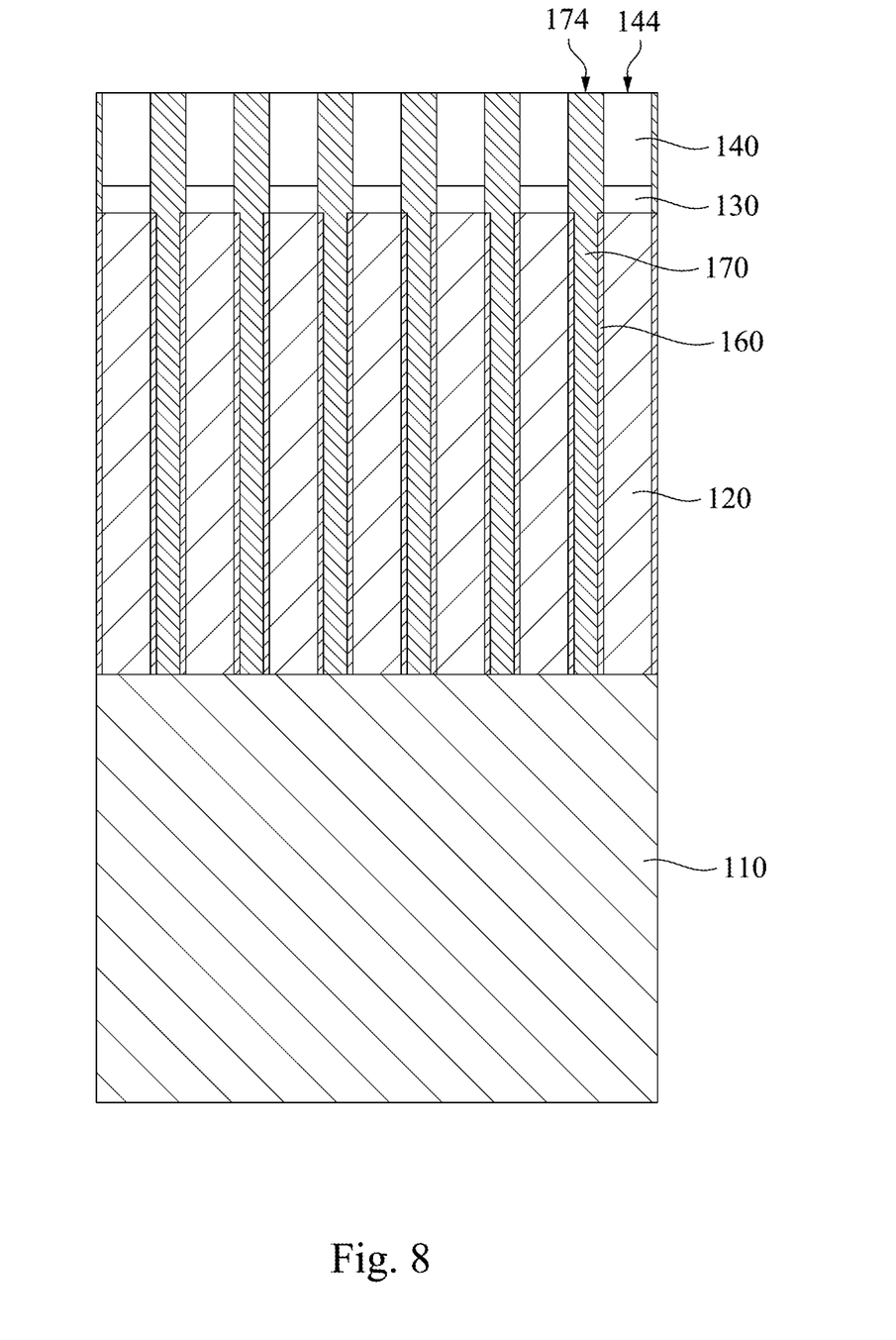

Referring to FIG. 8, after the second oxide structure 170 is formed, a planarization process, such as a CMP process, is performed to remove an upper portion of the second oxide structure 170. As such, a top surface 174 of the second oxide structure 170 and a top surface 144 of the second pad layer 140 are substantially at same horizontal level.

Figure 9:
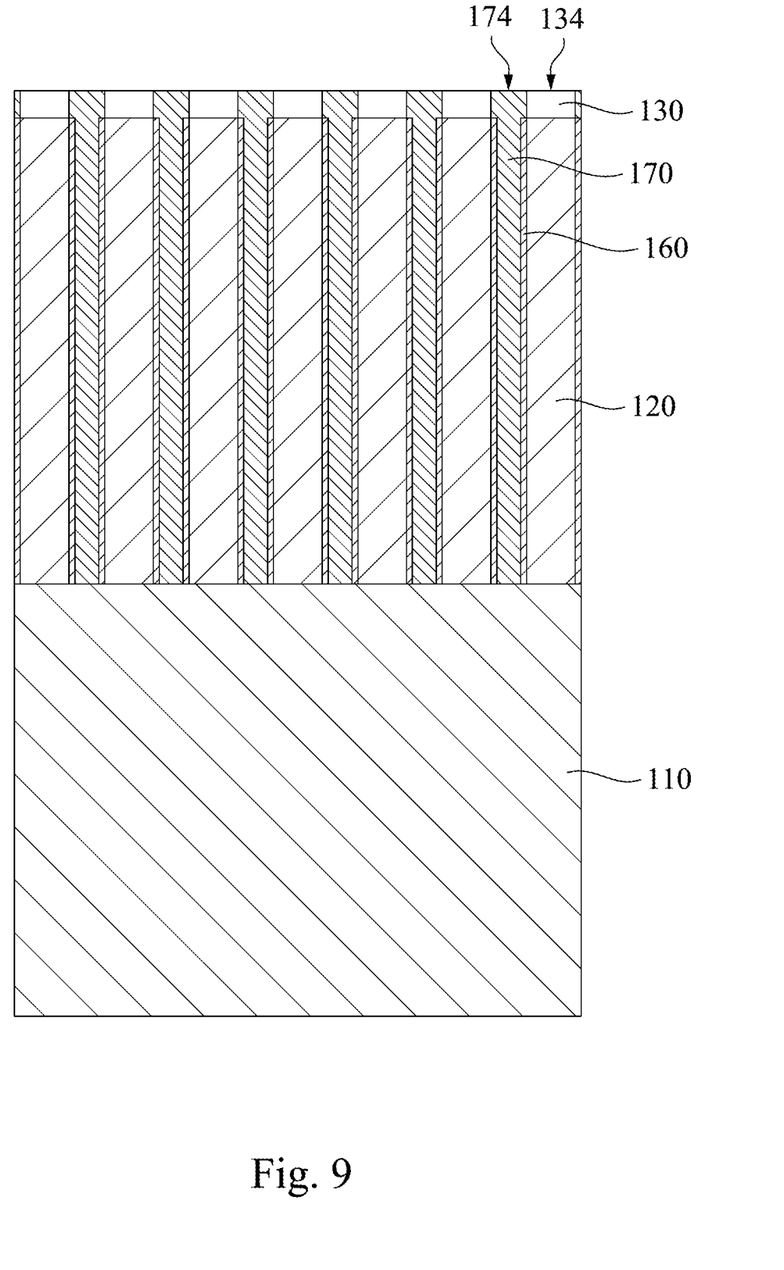
Figure 10:
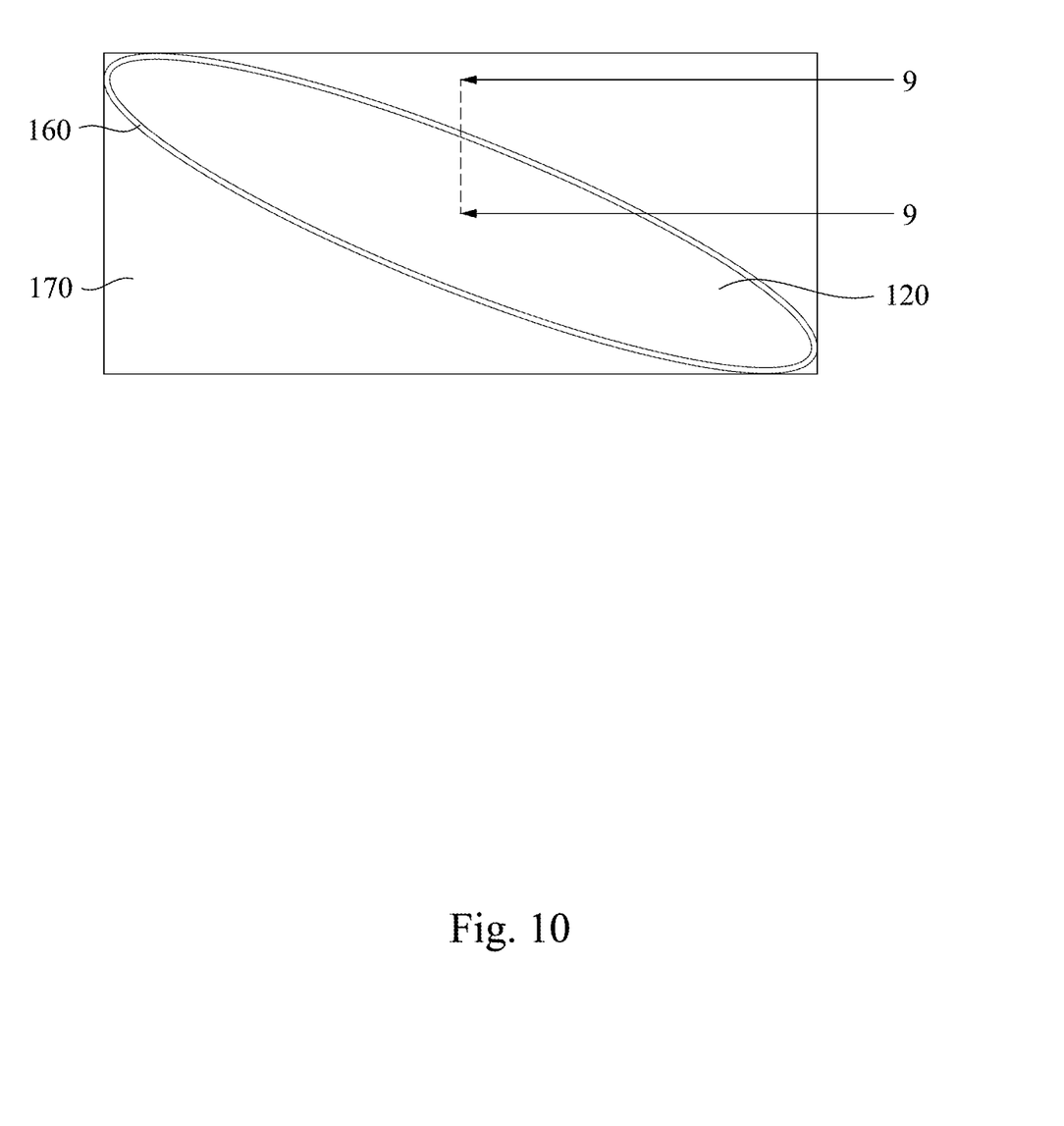
FIG. 10 is a top view of the semiconductor structure of FIG. 9.

Referring to FIG. 9 and FIG. 10, FIG. 10 is a top view of the semiconductor structure of FIG. 9. Stated differently, FIG. 9 is a cross-sectional view of the semiconductor structure taken along line 9-9 of FIG. 10. For clarity, the first pad layer 130 of FIG. 9 is not shown in FIG. 10. After the planarization process is performed, the second pad layer 140 and portions of the second oxide structure 170 adjacent to the second pad layer 140 are removed, such that the first pad layer 130 is exposed. In some embodiments, the top surface 174 of the second oxide structure 170 and a top surface 134 of the first pad layer 130 are substantially at same horizontal level.

In some embodiments, a bit line contact may be formed over a central portion of the semiconductor material structure 120 (active area), and a cell contact may be formed over an edge portion of the semiconductor material structure 120 (active area). Since the shift problem is solved in response to the above-mentioned processes, the bit line contact and the cell contact over the semiconductor material structure 120 (active area) can be arranged precisely, and the short problem can be avoided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a substrate;
   a semiconductor material structure over the substrate;
   a pad layer over the semiconductor material structure;
   a first oxide structure on a sidewall of the semiconductor material structure; and
   a second oxide structure on a sidewall of the first oxide structure and a sidewall of the pad layer, wherein a topmost surface of the second oxide structure is coplanar with a topmost surface of the pad layer and above a topmost surface of the first oxide structure.

2. The semiconductor structure of claim 1, wherein the second oxide structure is in contact with the sidewall of the first oxide structure and the sidewall of the pad layer.

3. The semiconductor structure of claim 1, wherein the second oxide structure and the semiconductor material structure are separated by the first oxide structure.

4. The semiconductor structure of claim 1, wherein the first oxide structure and the second oxide structure are made of same materials.

\* \* \* \* \*